(12) United States Patent
Gardella et al.

(10) Patent No.: US 12,266,603 B2
(45) Date of Patent: Apr. 1, 2025

(54) SEMICONDUCTOR DEVICE TO REDUCE SIGNAL LOSS IN A TRANSMISSION LINE

(71) Applicant: Allegro MicroSystems, LLC, Manchester, NH (US)

(72) Inventors: Pablo Jesús Gardella, Heidelberg (DE); Eduardo Mariani, Ciudad Autonoma de Buenos Aires (AR); Brenda Rossi, Pilar (AR)

(73) Assignee: Allegro MicroSystems, LLC, Manchester, NH (US)

( * ) Notice: Subject to any disclaimer, the term of this patent is extended or adjusted under 35 U.S.C. 154(b) by 504 days.

(21) Appl. No.: 17/661,763

(22) Filed: May 3, 2022

(65) Prior Publication Data

US 2023/0361020 A1 Nov. 9, 2023

(51) Int. Cl.
*H01L 23/522* (2006.01)
*H01L 23/528* (2006.01)
*H01L 23/532* (2006.01)
*H01L 23/552* (2006.01)
*H01L 23/66* (2006.01)

(52) U.S. Cl.
CPC ........ *H01L 23/5226* (2013.01); *H01L 23/528* (2013.01); *H01L 23/53257* (2013.01); *H01L 23/552* (2013.01); *H01L 23/66* (2013.01); *H01L 2223/6616* (2013.01)

(58) Field of Classification Search
CPC . H01L 23/5225; H01L 23/552; H01L 23/525; H01L 2223/6616; H01L 27/0259–0285; H01L 23/66; H01L 21/76; H01L 21/765; H01L 29/0642; H01L 2225/06537; H01L 2223/66; H01L 2223/6672; H01L 2924/1903; H01L 21/823481; H05K 1/0224; H10D 89/711–819; H10D 62/114; H10D 62/113

See application file for complete search history.

(56) References Cited

U.S. PATENT DOCUMENTS

| | | | |
|---|---|---|---|
| 6,066,537 A * | 5/2000 | Poh | H01L 23/5223 438/251 |
| 9,368,486 B2 | 6/2016 | Wang et al. | |
| 10,326,621 B1 | 6/2019 | Geisler et al. | |
| 10,481,218 B2 | 11/2019 | Prentice et al. | |
| 10,495,700 B2 | 12/2019 | Prentice et al. | |
| 11,195,826 B2 | 12/2021 | Klebanov et al. | |
| 2002/0074605 A1* | 6/2002 | Gamand | H01L 23/552 257/E23.114 |
| 2007/0262422 A1* | 11/2007 | Bakalski | H01L 23/552 257/659 |
| 2010/0264509 A1* | 10/2010 | Jou | H01L 23/5225 257/504 |
| 2021/0375799 A1* | 12/2021 | Gorbachov | H01P 3/006 |

* cited by examiner

*Primary Examiner* — Alia Sabur
(74) *Attorney, Agent, or Firm* — DALY, CROWLEY, MOFFORD & DURKEE, LLP

(57) ABSTRACT

A semiconductor device that includes an epitaxial layer having a first-type dopant, a first well having a second-type dopant, a base layer having the second-type dopant, a first metal layer comprising a first base terminal and an inner conductor, and a first via connecting the first base terminal to the first well. The base layer is formed within the epitaxial layer and in contact with the first well and at least one dielectric separates the inner conductor from the first base terminal, and the base layer.

22 Claims, 4 Drawing Sheets

SEMICONDUCTOR DEVICE TO REDUCE SIGNAL LOSS IN A TRANSMISSION LINE

BACKGROUND

A metal line on a semiconductor device is prone to signal loss. In general, a way to protect the metal line from signal loss is by shielding the metal line on four sides with metal, leading to a transmission line structure. A first metal layer is formed above an inner conductor (a top shield), and a second metal layer is formed below the inner conductor (a bottom shield). A third metal layer is formed on one side of the inner conductor, and a fourth metal layer is formed on the other side of the inner conductor. None of external conductors (i.e., the top shield, the bottom shield and the side shields) are in contact with the inner conductor. Thus, the metal line is shielded on four sides.

SUMMARY

In one aspect, a semiconductor device that includes an epitaxial layer having a first-type dopant, a first well having a second-type dopant, a base layer having the second-type dopant, a first metal layer comprising a first base terminal and an inner conductor, and a first via connecting the first base terminal to the first well. The base layer is formed within the epitaxial layer and in contact with the first well and at least one dielectric separates the inner conductor from the first base terminal, and the base layer.

In another aspect, a method comprising includes reducing transmission line losses in a semiconductor device. The semiconductor device includes an epitaxial layer having a first-type dopant, a first well having a second-type dopant, a base layer having the second-type dopant, the base layer formed within the epitaxial layer and in contact with the first well, a first metal layer comprising a first base terminal and an inner conductor and a first via connecting the first base terminal to the first well. At least one dielectric separates the inner conductor from the first base terminal, and the base layer. Reducing the transmission line losses includes applying a bias to the first base terminal.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a semiconductor device that reduces signal loss in a transmission line. In one example, the techniques described herein reduce the losses without having a metal layer below the inner conductor. Rather, the techniques describe herein add at least one terminal (also called herein a "base terminal") that is separated from, but formed on a same metal layer as, an inner conductor and that the at least one terminal is electrically connected to a base layer on the semiconductor device. In one example, the structure, which includes a base terminal, the base layer and the inner conductor, may be considered to be a transmission line. In one example, the terminal is biased, which forms a depletion region in the base layer. In another example, the terminal is not biased. Unlike traditional techniques which require three metal layers to reduce signal loss, the techniques described herein have less than three metal layers.

Figure 1:
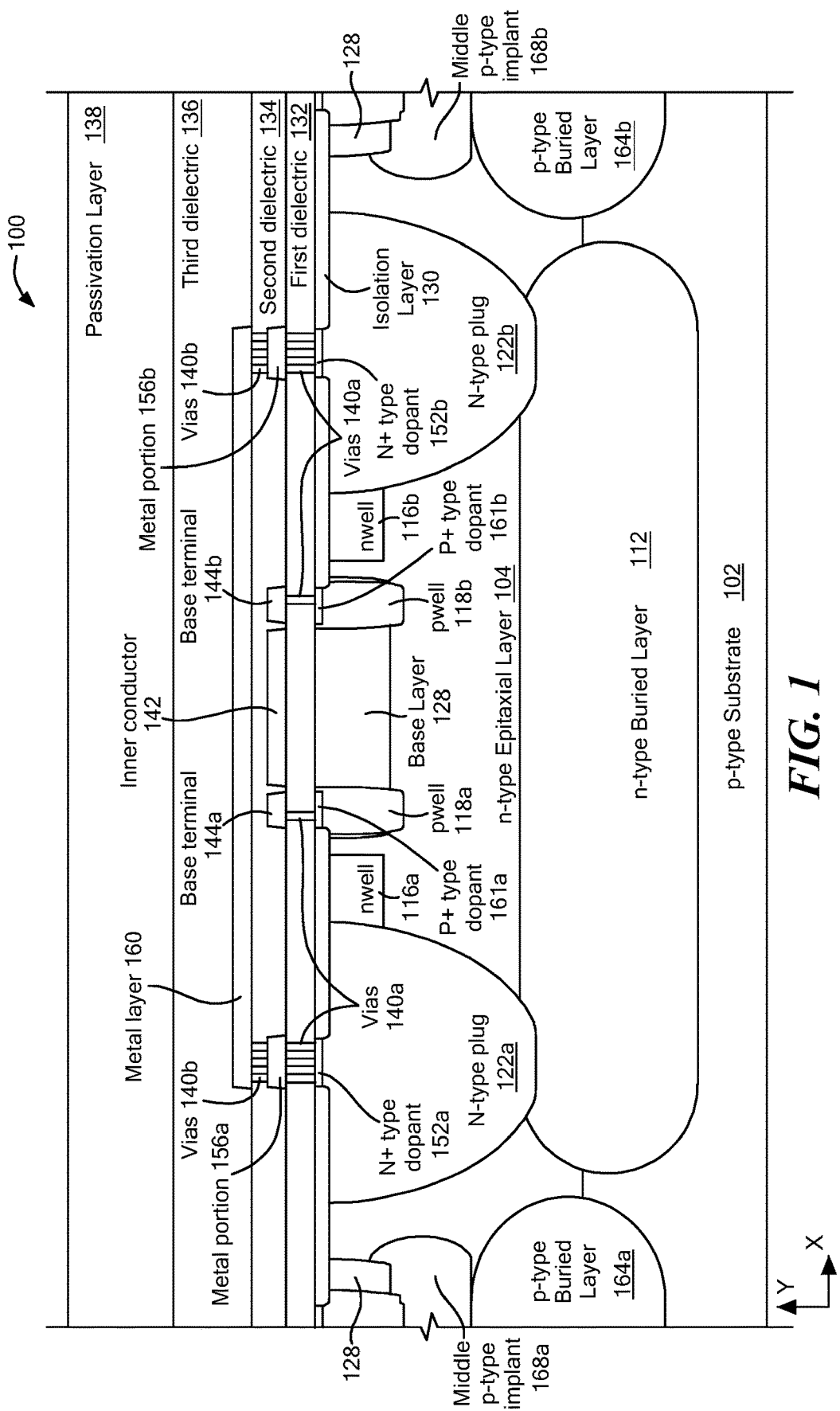
FIG. 1 is a cross-sectional diagram of an example of a semiconductor device that includes at least one well that reduces signal loss in a transmission line.

Referring to FIG. 1, a semiconductor device 100 includes a p-type substrate 102 and a n-type epitaxial 104 deposited on the p-type substrate 102. A n-type buried layer 112 is implanted into the n-type epitaxial layer 104 and the p-type substrate 102. In one example, the semiconductor device 100 may include one or more of a transistor (e.g., a meta-oxide-semiconductor transistor, a bipolar junction transistor), a capacitor, a resistor and/or a diode.

N-type plugs (e.g., n-type plug 122a, n-type plug 122b) is implanted above the n-type buried layer 112. N-type wells (e.g., n-type well 116a, n-type well 116b) are implanted into the epitaxial layer 104. The n-type well 116a is in contact with the n-type plug 122a, and n-type well 116b is in contact with the n-type plug 122b. An insolation layer 130 is deposited on the n-type wells 116a, 116b; the n-type plugs 122a, 122b; and on the epitaxial layer 104.

P-type wells (e.g., p-type well 118a, p-type well 118b) are implanted into the epitaxial layer 104. A n-type base layer 128 is implanted into the epitaxial layer 104 between and in contact with the p-type well 118a and the p-type well 118b.

A N+ dopant region 152a is formed on the n-type plug 122a, and a N+ dopant region 152b is formed on the n-type plug 122b. A P+ dopant region 161a is formed on the p-type well 118a, and a P+ dopant region 161b is formed on the p-type well 161b.

A first dielectric 132 is deposited on the isolation layer 130; the N+ dopant regions 152a, 152b; and the P+ dopant region 161a, 161bs. Vias 140a are formed in the first dielectric 132. The vias 140a connect to the N+ dopant regions 152a, 152b; and the P+ dopant region 161a, 161bs. In one example, the vias 140a include electroconductive material (e.g., tungsten).

A first metal layer is formed on the first dielectric 132. The first metal layer includes an inner conductor 142. The inner conductor 142 is a transmission line. The first metal layer also includes a base terminal 144a, a base terminal 144b, a metal portion 156a and a metal portion 156b. In one example, the base terminals 144a, 144b each have a length in the X-direction of 1.1 microns±0.3 microns.

One or more vias 140a connect the metal portion 156a to the N+ type dopant region 152a and one or more vias 140a connect the metal portion 156b to the N+ type dopant region 152b. One or more vias 140a connect the base terminal 144a to the P+ type dopant region 161a and one or more vias 140a connect the base terminal 144b to the P+ type dopant region 161b.

A second dielectric 134 is deposited on the first dielectric 132. Vias 140b are formed in the second dielectric 134. One or more vias 140b connect to each of the metal portions 156a, 156b. In one example, the vias 140b include electroconductive material (e.g., tungsten).

A second metal layer 160 is formed on the second dielectric 134 and on the vias 140b so that the metal layer 160 is in electrical contact with the metal portions 156a, 156b and in electrical contact with the N+ regions 152a, 152b.

The semiconductor device 100 also includes p-type buried layers 164a, 164b that are implanted into the p-type substrate 102 and the epitaxial layer 104; and middle p-type implant regions 168a, 168b each on a respective p-type buried layer 164a, 164b.

The semiconductor device 100 provides reduced signal loss and better signal integrity on the transmission line (inner conductor 142) compared to traditional technique even when the base terminal 144a (and/or base terminal 144b) is not biased (an unbiased mode). However, when the base terminal 144a (and/or the base terminal 144b) is biased (a biased mode) by a negative voltage, a depletion region forms in the base layer 128 and the transmission line (inner conductor 142) has an improved shielding and better signal integrity compared to the unbiased mode.

Figure 2:
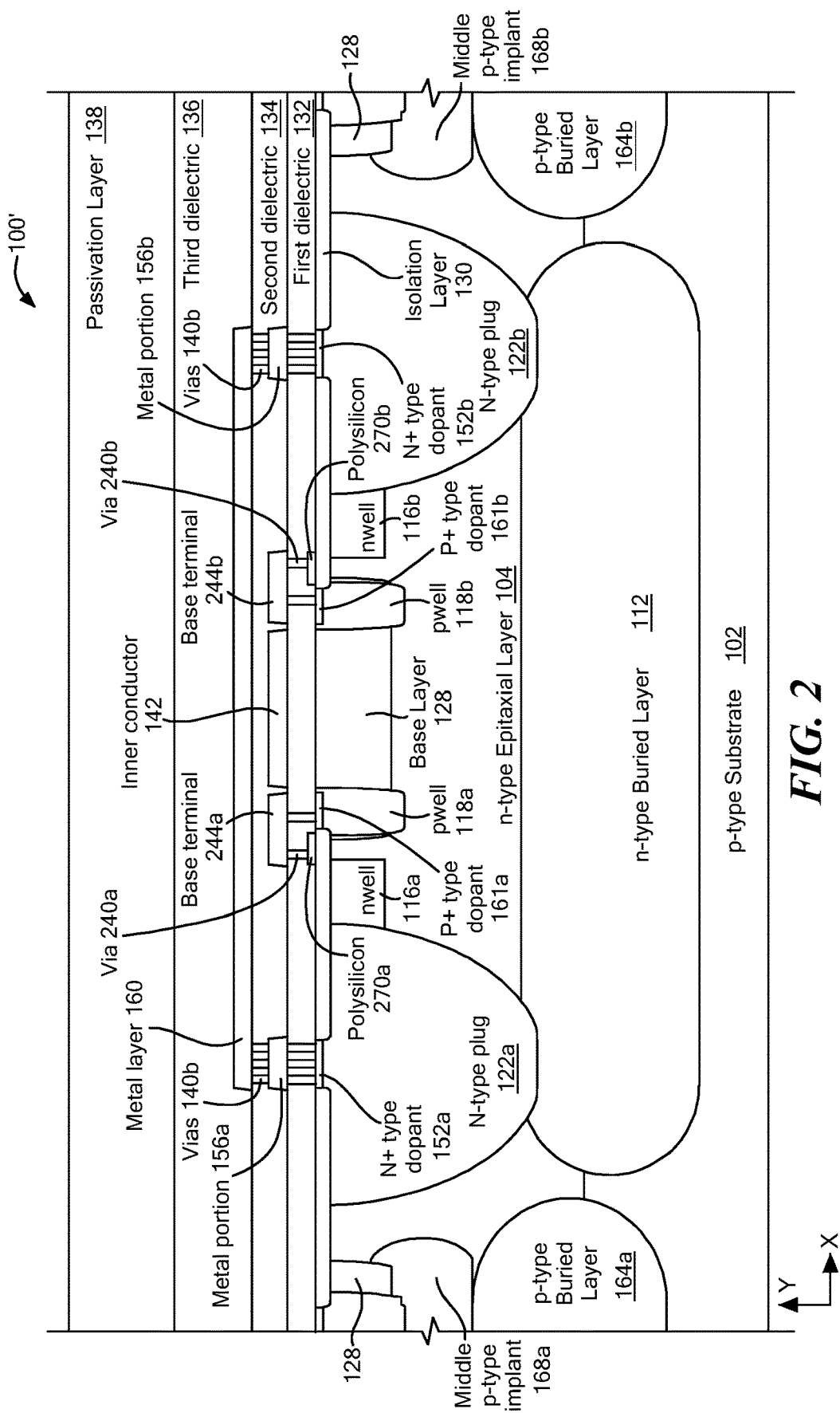
FIG. 2 is a cross-sectional diagram of another example of the semiconductor device of FIG. 1 that further includes a polysilicon layer.

Referring to FIG. 2, an example of the semiconductor device 100 (FIG. 1) is a semiconductor device 100'. The semiconductor device 100' is similar to semiconductor device 100 and further includes a polysilicon region 270a, 270b. The polysilicon region 270a is connected to a base terminal 144a by a via 240a. The polysilicon region 270b is connected to a base terminal 244b by a via 240b. In one example, the base terminals 244a, 244b each have a length in the X-direction of 2.2 microns±0.6 microns. In one example, the vias 240a, 240b include electroconductive material (e.g., tungsten).

Figure 3:
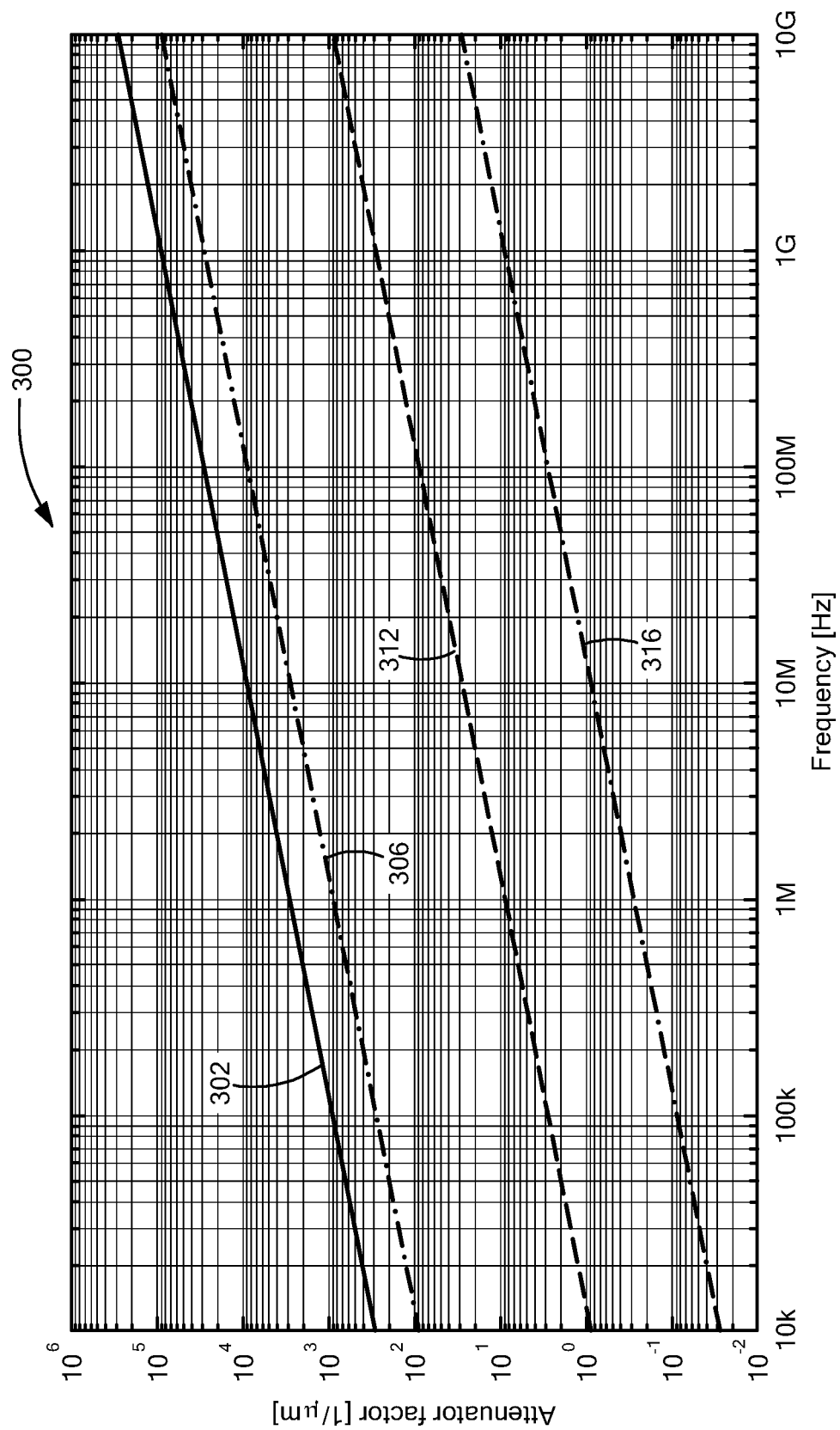
FIG. 3 is a graph of an example of an attenuation factor versus frequency for different donor concentrations in silicon at a temperature of 300° Kelvin.

Referring to FIG. 3, a graph 300 is an example of an attenuation factor versus a frequency for different donor concentrations in silicon at a temperature of 300° Kelvin. A curve 302 represents a doping concentration of $10^{21}$ cm$^{-3}$ for the n-type plug 122a, 122b (FIG. 1). A curve 306 represents a doping concentration of $10^{19}$ cm$^{-3}$ for the n-type buried layer 112 (FIG. 1). A curve 312 represents a doping concentration of $10^{15}$ cm$^{-3}$ for an unbiased base layer 128 (FIG. 1). A curve 316 represents a doping concentration of $10^{12}$ cm$^{-3}$ for a biased base layer 128 (FIG. 1).

Figure 4:
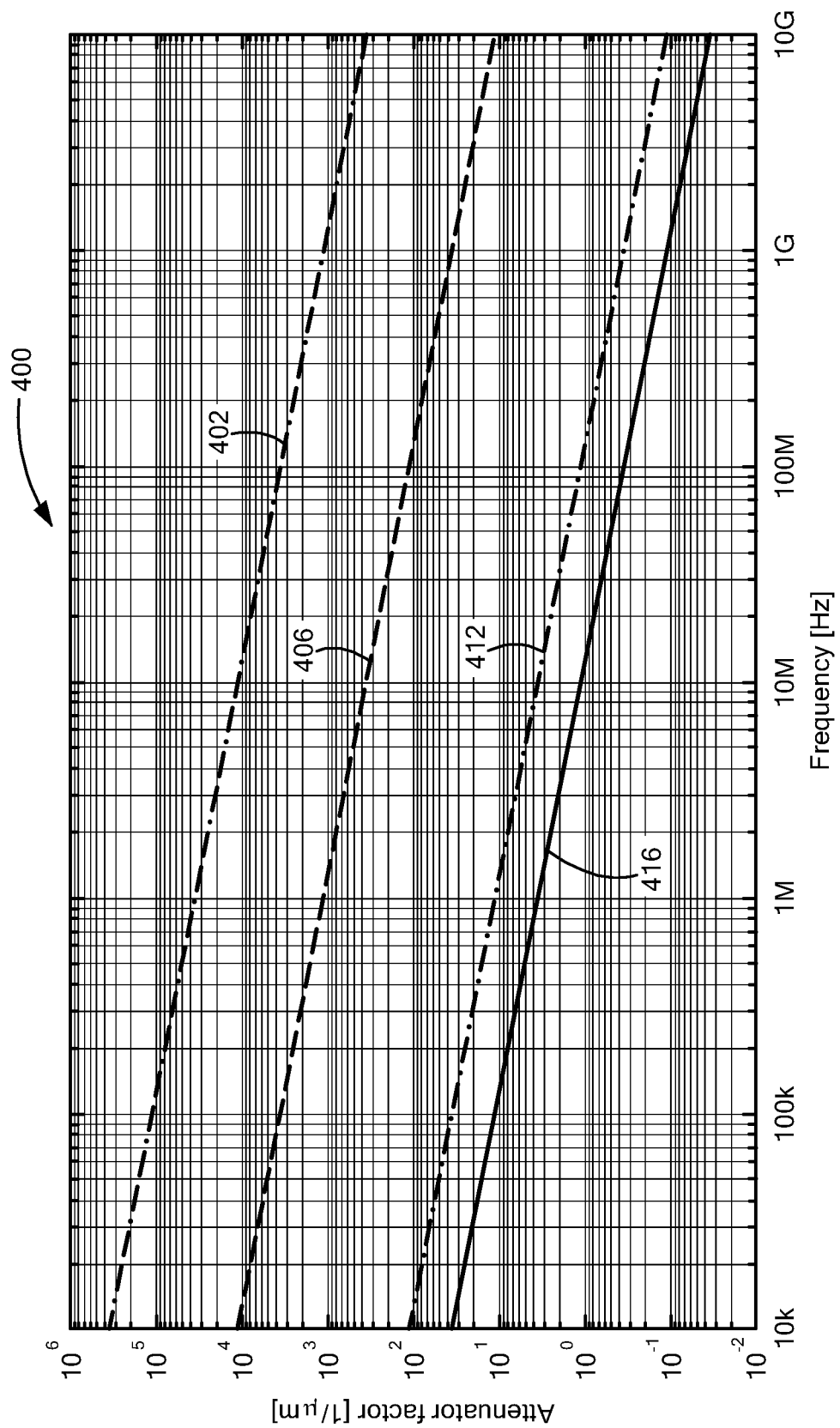
FIG. 4 is a graph of an example of penetration depth versus frequency for different donor concentrations in silicon at a temperature of 300° Kelvin.

Referring to FIG. 4, a graph 400 is an example of penetration depth versus frequency for different donor concentrations in silicon at a temperature of 300° Kelvin. A curve 416 represents a doping concentration of $10^{21}$ cm$^{-3}$ for the n-type plug 122a, 122b (FIG. 1). A curve 412 represents a doping concentration of $10^{19}$ cm$^{-3}$ for the n-type buried layer 112 (FIG. 1). A curve 406 represents a doping concentration of $10^{15}$ cm$^{-3}$ for an unbiased base layer 128 (FIG. 1). A curve 402 represents a doping concentration of $10^{12}$ cm$^{-3}$ for a biased base layer 128 (FIG. 1).

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A semiconductor device comprising:
   an epitaxial layer having a first-type dopant;
   a first well having a second-type dopant;
   a base layer having the second-type dopant, the base layer formed within the epitaxial layer and in contact with the first well;
   a first metal layer comprising a first base terminal and an inner conductor;
   a first via connecting the first base terminal to the first well;
   an isolation layer on the epitaxial layer;
   a polysilicon region on the isolation layer; and
   a second via connecting the first base terminal to the polysilicon region,
   wherein at least one dielectric separates the inner conductor from the first base terminal, and the base layer.

2. The semiconductor device of claim 1, wherein, in operation, a voltage is applied to the inner conductor forming a depleted region in the base layer.

3. The semiconductor device of claim 1, further comprising:
   a second well having the second-type dopant;
   a second base terminal; and
   a second via connecting the second base terminal to the second well,
   wherein the base layer is between, and in contact with, the first well and the second well,
   wherein the first metal layer further comprises the second base terminal, and
   wherein the at least one dielectric separates the inner conductor from the first base terminal, the second base terminal and the base layer.

4. The semiconductor device of claim 3, wherein the first metal layer further comprises a first metal portion, and further comprising:
   a first plug having the first-type dopant, the first plug formed in the epitaxial layer;
   a second metal layer;
   a first plurality of vias connecting the first metal portion of the first metal layer to the first plug; and
   a second plurality of vias connecting the first metal portion of the first metal layer to the second metal layer.

5. The semiconductor device of claim 4, wherein the first metal layer further comprises a second metal portion, and further comprising:
   a second plug having the first-type dopant, the second plug formed in the epitaxial layer;
   a third plurality of vias connecting the second metal portion of the first metal layer to the second plug; and
   a fourth plurality of vias connecting the second metal portion of the first metal layer to the second metal layer.

6. The semiconductor device of claim 5, further comprising a silicon substrate having a second-type dopant,
   wherein the epitaxial layer is in contact with the substrate.

7. The semiconductor device of claim 6, further comprising a buried layer having a first-type dopant,
   wherein the buried layer is in contact with the substrate, the first plug and the second plug.

8. The semiconductor device of claim 1, wherein the first-type dopant is a n-type dopant, and
   wherein the second-type dopant is an p-type dopant.

9. The semiconductor device of claim 8, wherein, in operation, a negative voltage is applied to the inner conductor to form a depleted region in the base layer.

10. A semiconductor device comprising:
    an epitaxial layer having a first-type dopant;
    a first well having a second-type dopant;
    a base layer having the second-type dopant, the base layer formed within the epitaxial layer and in contact with the first well;
    a first metal layer comprising a first base terminal and an inner conductor;
    a first via connecting the first base terminal to the first well, wherein at least one dielectric separates the inner conductor from the first base terminal, and the base layer, and further including:
an isolation layer on the epitaxial layer, the isolation layer comprising a first portion and a second portion;
a first polysilicon region on the first portion of the isolation layer;
a second polysilicon region on the second portion of the isolation layer;
a third via connecting the first base terminal to the first polysilicon region; and
a fourth via connecting the second base terminal to the second polysilicon region.

11. The semiconductor device of claim 10, further comprising:
an isolation layer on the epitaxial layer;
a polysilicon region on the isolation layer; and
a second via connecting the first base terminal to the polysilicon region.

12. The semiconductor device of claim 10, further comprising:
a second well having the second-type dopant;
a second base terminal; and
a second via connecting the second base terminal to the second well,
wherein the base layer is between, and in contact with, the first well and the second well,
wherein the first metal layer further comprises the second base terminal, and
wherein the at least one dielectric separates the inner conductor from the first base terminal, the second base terminal and the base layer.

13. The semiconductor device of claim 12, wherein the first metal layer further comprises a first metal portion, and further comprising:
a first plug having the first-type dopant, the first plug formed in the epitaxial layer;
a second metal layer;
a first plurality of vias connecting the first metal portion of the first metal layer to the first plug; and
a second plurality of vias connecting the first metal portion of the first metal layer to the second metal layer.

14. The semiconductor device of claim 13, wherein the first metal layer further comprises a second metal portion, and further comprising:
a second plug having the first-type dopant, the second plug formed in the epitaxial layer;
a third plurality of vias connecting the second metal portion of the first metal layer to the second plug; and
a fourth plurality of vias connecting the second metal portion of the first metal layer to the second metal layer.

15. The semiconductor device of claim 14, further comprising a silicon substrate having a second-type dopant,
wherein the epitaxial layer is in contact with the substrate.

16. The semiconductor device of claim 15, further comprising a buried layer having a first-type dopant,
wherein the buried layer is in contact with the substrate, the first plug and the second plug.

17. A method comprising:
reducing losses in a transmission line losses in a semiconductor device, wherein the semiconductor device comprises:
an epitaxial layer having a first-type dopant;
a first well having a second-type dopant;
a base layer having the second-type dopant, the base layer formed within the epitaxial layer and in contact with the first well;
a first metal layer comprising a first base terminal and an inner conductor;
a first via connecting the first base terminal to the first well, and
wherein at least one dielectric separates the inner conductor from the first base terminal, and the base layer; and
wherein shielding the transmission line comprises applying a bias to the first base terminal, and wherein the semiconductor device further includes:
an isolation layer on the epitaxial layer;
a polysilicon region on the isolation layer; and
a second via connecting the first base terminal to the polysilicon region.

18. The method of claim 17, wherein applying a bias to the first base terminal comprises applying a negative voltage or a positive voltage to the first base terminal.

19. The method of claim 17, wherein applying a bias to the first base terminal forms a depletion region in the base layer.

20. The semiconductor device of claim 10, wherein, in operation, a voltage is applied to the inner conductor forming a depleted region in the base layer.

21. The semiconductor device of claim 10, wherein the first-type dopant is a n-type dopant, and
wherein the second-type dopant is an p-type dopant.

22. The semiconductor device of claim 21, wherein, in operation, a negative voltage is applied to the inner conductor to form a depleted region in the base layer.

* * * * *